(12) United States Patent
Blümel et al.

(10) Patent No.: US 8,497,145 B2
(45) Date of Patent: Jul. 30, 2013

(54) METHOD FOR PRODUCING AN OPTOELECTRONIC COMPONENT AND OPTOELECTRONIC COMPONENT

(75) Inventors: Simon Blümel, Schierling (DE); Folke Schneider-Pungs, Wolnzach (DE)

(73) Assignee: OSRAM Opto Semiconductors GmbH (DE)

( * ) Notice: Subject to any disclaimer, the term of this patent is extended or adjusted under 35 U.S.C. 154(b) by 162 days.

(21) Appl. No.: 12/742,508

(22) PCT Filed: Nov. 14, 2008

(86) PCT No.: PCT/DE2008/001888
§ 371 (c)(1),
(2), (4) Date: Jun. 30, 2010

(87) PCT Pub. No.: WO2009/067984
PCT Pub. Date: Jun. 4, 2009

(65) Prior Publication Data
US 2010/0258829 A1  Oct. 14, 2010

(30) Foreign Application Priority Data

Nov. 29, 2007 (DE) .......... 10 2007 057 470
Mar. 13, 2008 (DE) .......... 10 2008 014 122

(51) Int. Cl.
*H01L 21/00* (2006.01)
(52) U.S. Cl.
USPC .......... 438/29; 257/98; 257/E33.06

(58) Field of Classification Search
USPC .. 438/27–29, 34, 107, 112, 116, 126; 257/95, 257/98, 99, 100, E31.117, E33.059, E33.06
See application file for complete search history.

(56) References Cited

U.S. PATENT DOCUMENTS

| | | | |
|---|---|---|---|
| 5,635,115 A | 6/1997 | Konishi et al. | |
| 6,582,823 B1 | 6/2003 | Sakhrani et al. | |
| 6,730,933 B1 | 5/2004 | Shimizu et al. | |
| 8,017,246 B2 * | 9/2011 | Morita et al. ............ | 428/447 |
| 2002/0145152 A1 | 10/2002 | Shimomura | |
| 2002/0196563 A1 | 12/2002 | Itoh | |
| 2006/0263918 A1 | 11/2006 | Tasaki et al. | |
| 2007/0097162 A1 * | 5/2007 | Iwashita et al. ............ | 347/9 |
| 2007/0170454 A1 | 7/2007 | Andrews | |

FOREIGN PATENT DOCUMENTS

| | | |
|---|---|---|
| EP | 0 854 523 A2 | 7/1998 |
| EP | 1 341 278 A1 | 9/2003 |
| EP | 1 605 028 A1 | 12/2005 |
| JP | 2001-203395 A | 7/2001 |
| TW | 552722 | 9/2003 |
| TW | 2007-29550 | 8/2007 |

\* cited by examiner

*Primary Examiner* — David Vu
(74) *Attorney, Agent, or Firm* — DLA Piper LLP (US)

(57) ABSTRACT

A method for producing an optoelectronic component including providing a radiation-emitting device, heating the device and applying a liquid lens material in a beam path of the device, wherein, with crosslinking of the lens material, a lens shaped onto the device is formed.

10 Claims, 4 Drawing Sheets

METHOD FOR PRODUCING AN OPTOELECTRONIC COMPONENT AND OPTOELECTRONIC COMPONENT

RELATED APPLICATIONS

This is a §371 of International Application No. PCT/DE2008/001888, with an international filing date of Nov. 14, 2008 (WO 2009/067984 A2, published Jun. 4, 2009), which is based on German Patent Application Nos. 10 2007 057 470.5, filed Nov. 29, 2007, and 10 2008 014 122.4, filed Mar. 13, 2008, the subject matter of which is incorporated by reference.

TECHNICAL FIELD

This disclosure relates to a method for producing an optoelectronic component and the optoelectronic component.

BACKGROUND

Production of optoelectronic components having lenses has been realized heretofore by methods that entail high costs, high assembly complexity and lack of mechanical strength of the lens.

It could therefore be helpful to provide a cost-effective method which is simple to carry out and which enables a lens to be applied in an optoelectronic component.

SUMMARY

We provide a method for producing an optoelectronic component including A) providing a radiation-emitting device, B) heating the device and C) applying a liquid lens material in a beam path of the device, wherein, with crosslinking of the lens material, a lens shaped onto the device is formed.

We also provide an optoelectronic component produced according to the method, including a radiation-emitting device and a lens shaped onto the device.

BRIEF DESCRIPTION OF THE DRAWINGS

Our components and methods will be explained in greater detail with reference to the figures.

DETAILED DESCRIPTION

Figure 1:
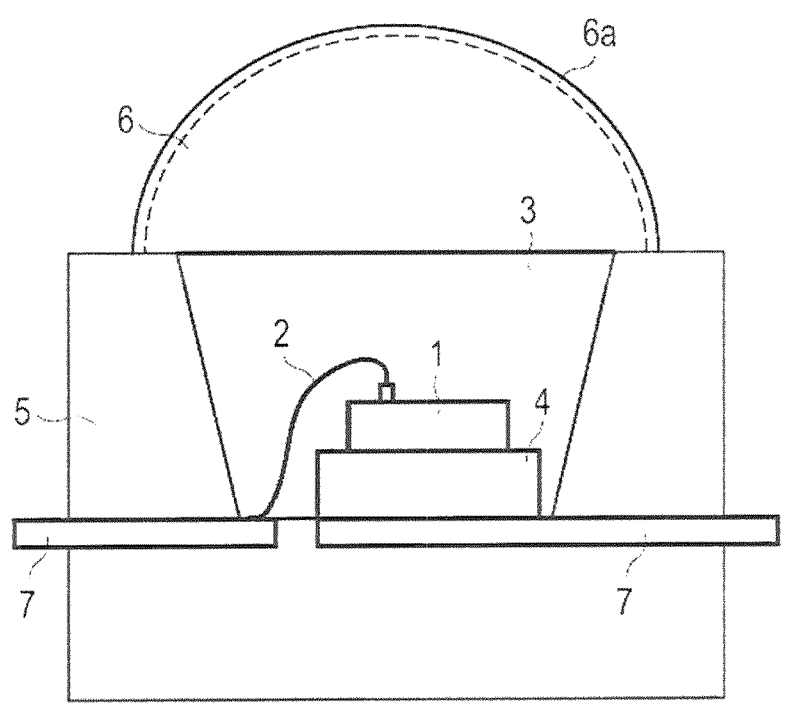
FIG. 1 shows a schematic cross section of an optoelectronic component.

We provide a method for producing an optoelectronic component comprising A) providing a radiation-emitting device, B) heating the device, and C) applying a liquid lens material in the beam path of the device, wherein, with crosslinking of the lens material, a lens shaped onto the device is formed. In other words, a lens material is applied to an already completed radiation-emitting device, such that a lens can form. This constitutes a simple production process in which the lens material is dispensed onto the preheated device and takes the form of a lens. Additional method steps such as separately applying and mechanically fixing an already finished lens on the radiation-emitting device are obviated.

Step A) can comprise the steps of A1) arranging a carrier in the cavity of a housing, A2) arranging a radiation-emitting semiconductor layer sequence on a carrier, and A3) applying a potting material to the semiconductor layer sequence. In other words, a radiation-emitting device is completed in step A) and provided for steps B) and C).

In step B), the radiation-emitting device can be heated to a temperature range of 80° to 180° C., for example, to a temperature of 150° C. At this temperature, the radiation-emitting device is not damaged, but is hot enough to lead to crosslinking of the lens material in step C).

Furthermore, in step C), the liquid lens material can be at a lower temperature than the radiation-emitting device. By way of example, the liquid lens material can be at room temperature. As a result, the liquid lens material does not crosslink as long as it does not come into contact with the radiation-emitting device. It is only when the lens material has been applied on the radiation-emitting device that it crosslinks under the temperature influence provided by the radiation-emitting device.

In step C), furthermore, the lens material can be applied dropwise to the radiation-emitting device and a drop can be formed on the radiation-emitting device. The drop is heated by the radiation-emitting device such that the lens material, which is thermally crosslinkable, thermally crosslinks on account of the heating of the radiation-emitting device. In other words, without a further method step, a lens shaped onto the radiation-emitting device is formed. The precise shape of the lens can be influenced by the process parameters. Process parameters include for example the temperature of the radiation-emitting device and of the lens material, and also the composition of the lens material. The flow rate of the lens material with which the material is applied to the radiation-emitting device can have a further influence on the shape of the lens.

Furthermore, the drop can be fixed by chemical reaction of the lens material with the potting material of the radiation-emitting device on the radiation-emitting device. The chemical reaction can comprise insipient dissolution and fusion of the lens material and of the potting material and also formation of chemical compounds between the materials. The lens shaped from the drop is thus fixed on the potting material without additional mechanical holders such as metal clips, for example, being required. A further step, that of securing a lens on the radiation-emitting device, is thus obviated. By virtue of the fact that no mechanical connection is present, the expansion behavior of the potting material and of the lens is not influenced, and so no mechanical stresses arise.

The method can furthermore comprise a step C1) succeeding step C), in which step C1) the lens is subjected to a plasma, whereby a non-wetting surface layer of the lens is formed. The surface layer can be a glass layer that arises as a result of the plasma treatment of the lens material. Such a surface layer is non-wetting, and so no dust particles or structural parts can easily adhere to the lens. Further methods for obtaining a non-wetting surface layer of the lens can comprise the use of a specific mixture of the lens material or an additional coating of the finished shaped lens.

An optoelectronic component which is produced according to the method described above and comprises a radiation-emitting device and also a lens shaped onto the device is furthermore specified. Such an optoelectronic component has a high radiation intensity that is generated through the lens arranged in the beam path of the radiation-emitting device.

The lens material can comprise a silicone gel which crosslinks to give a silicone resin under the temperature influence of the radiation-emitting device and can thus be thermally crosslinkable. The silicone gel can furthermore comprise hardeners, catalysts or further additives which are admixed with the silicone gel before the silicone gel is applied dropwise to the device and which influence the constitution of the resin in accordance with the desired properties of the lens. By way of example, an increase in the proportion of the hardener in the silicone gel leads to a less tacky and less gel-like silicone resin. Silicone resins can also be used at high light intensity without being damaged. Furthermore, such a lens material is cost-effective, which improves the expediency of the production process for the optoelectronic component.

The optoelectronic component can have a radiation-emitting device comprising a carrier and a semiconductor layer sequence on the carrier, which are arranged in the cavity of a housing. Furthermore, a potting material can be arranged over the semiconductor layer sequence in the cavity of the housing. The potting material can comprise a silicone resin, for example, which corresponds to or is different than the silicone resin of the lens material. The potting material can furthermore comprise an epoxy resin. The semiconductor layer sequence can comprise an LED chip.

Turning now to the drawings, FIG. 1 shows a schematic cross section of an optoelectronic component comprising a radiation-emitting device and a lens. The radiation-emitting device comprises a semiconductor layer sequence 1, which is contact-connected directly to a printed circuit board 7 and via a connection 2 to a printed circuit board 7. The semiconductor layer sequence is furthermore arranged on the carrier 4. The semiconductor layer sequence 1 and the carrier 4 are situated in the cavity of a housing 5. Potting material 3 is additionally arranged in the cavity. The lens 6 is arranged above the potting material 3 and the housing, the lens comprising a surface layer 6a. The potting material 3 and the lens 6a are composed of materials which can react chemically with one another when the lens material is applied to the preheated radiation-emitting device. By way of example, the potting material and the material of the lens can be identical or mutually different silicone resins. The surface layer of the lens can be a glass layer that arises as a result of a plasma treatment of the lens. It can furthermore comprise an additionally applied coating comprising materials that have non-tacky and non-wetting properties. The lens 6 is thus fixed by a chemical compound formed between the lens material and the potting material 3 on the radiation-emitting device. It is shaped in such a way that it leads to a high radiation intensity of the emitted light from the radiation-emitting device. As a result of the surface layer 6a, the lens 6 does not attract dirt and is not tacky for other structural parts.

Figure 2A:
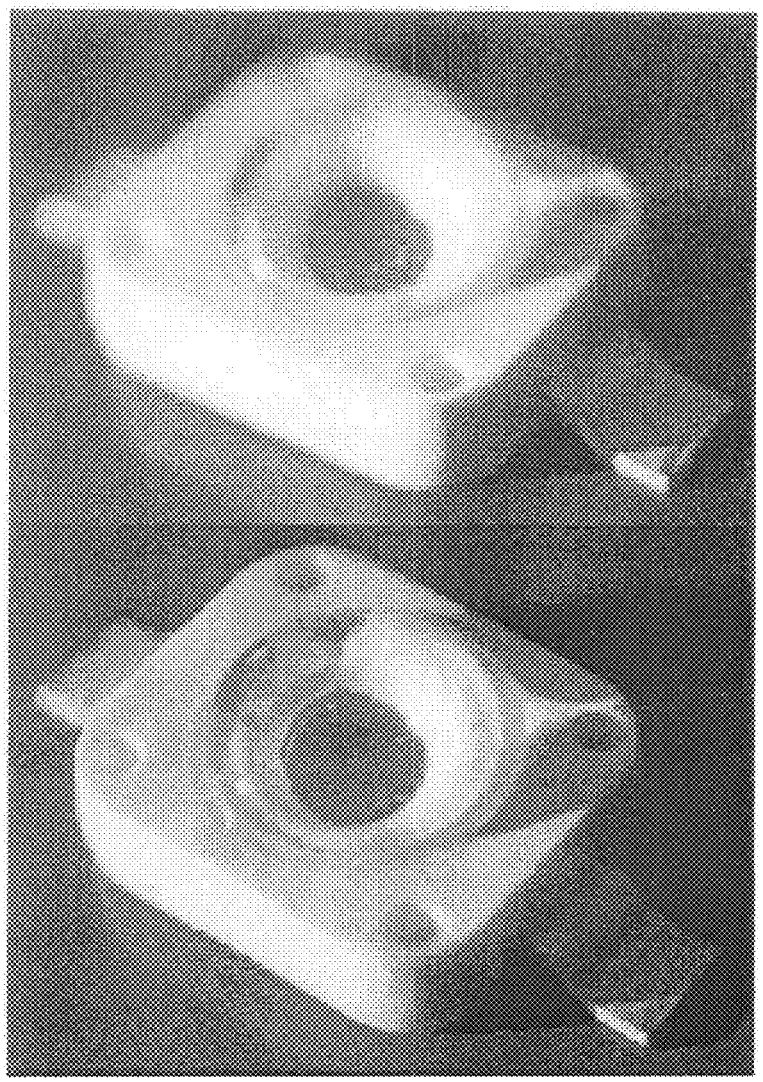
FIG. 2 shows, in FIGS. 2a and 2b, pictures of a radiation-emitting device with lens.
Figure 2B:
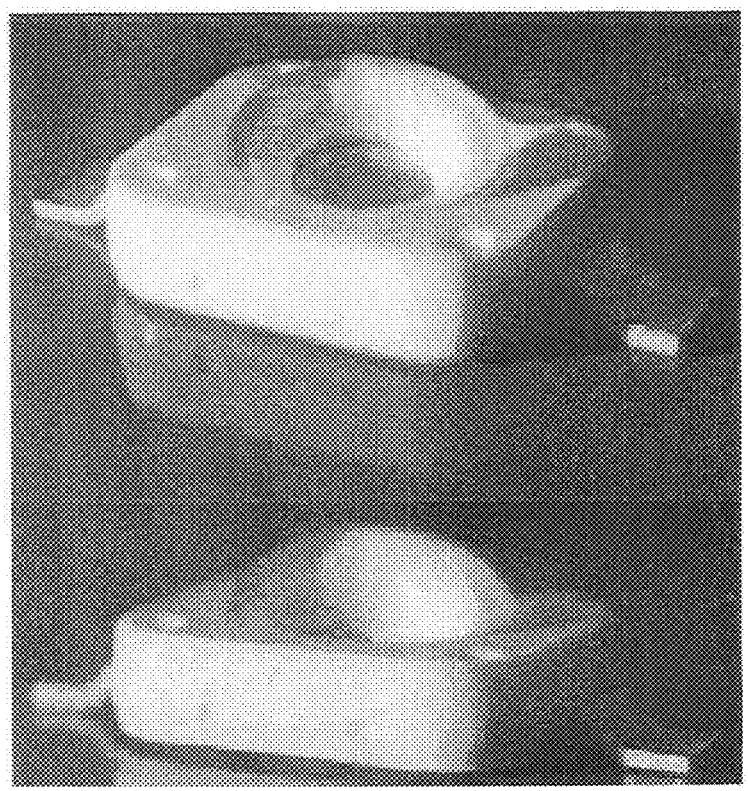

FIG. 2 shows the perspective view of a radiation-emitting device with lens in FIG. 2a, and the side view of this radiation-emitting device with lens in FIG. 2b. The radiation-emitting device is an LED chip, on which a lens composed of silicone resin has been applied. The lens was applied to the LED chip dropwise in the shape of a liquid lens material, for example, a silicone gel in the method described above, the LED chip having been heated. As a result, the lens material crosslinked and solidified in the shape of a lens in the LED chip. The lens was thus applied to the LED chip in a simple cost-effective process. Additional mechanical fixtures are not necessary. The LED chip moreover also has side arms that make it possible to solder the chip onto or at other structural parts.

Figure 3:
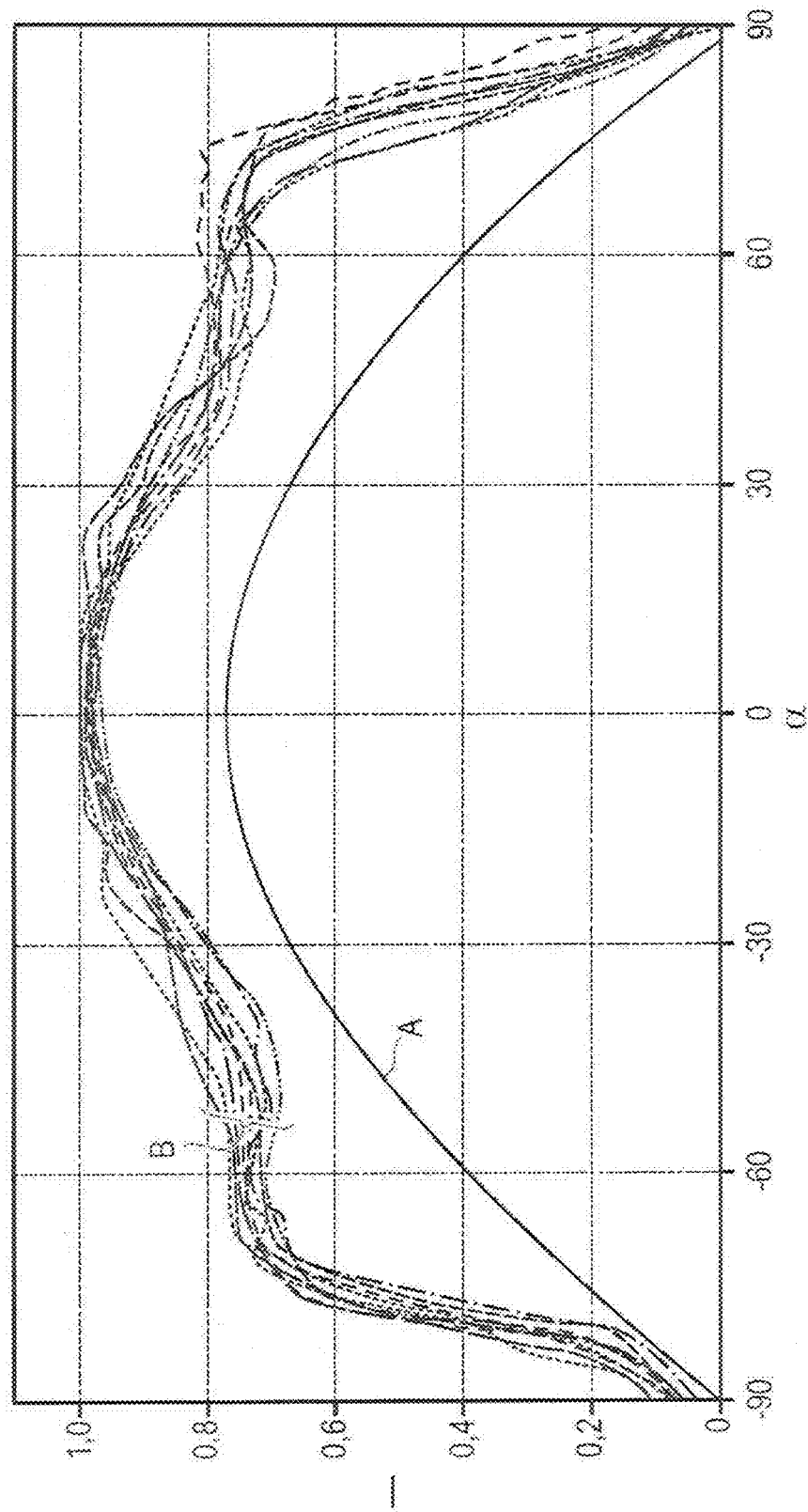
FIG. 3 shows the emission characteristic of the optoelectronic component.

FIG. 3 shows the emission characteristic of the emitted light from an optoelectronic component comprising a radiation-emitting device with lens. FIG. 3 shows the intensity I in arbitrary units against the emission angle α in °. The line A shows an ideal cosine curve representing the emission characteristic of a radiation-emitting device without a lens. The measurement data B show intensity measurements of a radiation-emitting device, an LED chip, on which a lens has been applied according to the method described above. It is evident that the radiation intensity of the radiation-emitting device is increased by the lens since the efficiency of the emitted radiation, represented by the area under the curves, has increased by approximately 20% in comparison with the cosine curve.

The emission characteristic is altered by the application of the lens in relation to a radiation-emitting device without a lens, which can be seen from the different peaks of the measurement data. That is unimportant, however, in many applications of optoelectronic components.

The examples shown in FIGS. 1 to 3 can be varied as desired. It should furthermore be taken into consideration that this disclosure is not restricted to the examples, but rather permits further configurations not presented here.

The invention claimed is:

1. A method for producing an optoelectronic component comprising:
    A) providing a radiation-emitting device,
    B) heating the device, and
    C) applying a liquid lens material on the pre-heated device in a beam path of the device, wherein, with crosslinking of the lens material, a lens shaped onto the device is formed from the liquid lens material.

2. The method of claim 1, wherein step A) comprises:
    A1) arranging a carrier in a cavity of a housing,
    A2) arranging a radiation-emitting semiconductor layer sequence on a carrier, and
    A3) applying a potting material to the semiconductor layer sequence.

3. The method of claim 1, wherein, in step B), the radiation-emitting device is heated to a temperature range of 80° C. to 180° C.

4. The method of claim 1, wherein, in step C), the liquid lens material is at a lower temperature than the radiation-emitting device.

5. The method of claim 4, wherein, in step C), the lens material is applied dropwise to the radiation-emitting device and a drop is formed on the radiation-emitting device.

6. The method of claim 5, wherein the drop is fixed by chemical reaction of the lens material with potting material on the radiation-emitting device.

7. The method of claim 1, wherein the liquid lens material is thermally crosslinkable and is thermally crosslinked by heating of the radiation-emitting device.

8. The method of claim 1, further comprising in a step C1) following step C), wherein the lens is subjected to a plasma, whereby a non-wetting surface layer of the lens is formed.

9. An optoelectronic component produced according to the method of claim 1, comprising the radiation-emitting device and a lens comprising a silicone resin shaped onto the device, wherein the radiation-emitting device comprises a housing, a carrier and a semiconductor layer sequence on the carrier arranged in a cavity of a housing and wherein a potting material is arranged over the semiconductor layer sequence in the cavity of the housing.

10. The optoelectronic component of claim 9, wherein the semiconductor layer sequence comprises an LED chip.

* * * * *